US009142392B2

(12) United States Patent
Bassom

(10) Patent No.: US 9,142,392 B2
(45) Date of Patent: Sep. 22, 2015

(54) SELF-CLEANING RADIO FREQUENCY PLASMA SOURCE

(71) Applicant: Varian Semiconductor Equipment Associates, Inc., Gloucester, MA (US)

(72) Inventor: Neil J. Bassom, Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 197 days.

(21) Appl. No.: 13/958,809

(22) Filed: Aug. 5, 2013

(65) Prior Publication Data

US 2014/0320012 A1      Oct. 30, 2014

Related U.S. Application Data

(60) Provisional application No. 61/817,200, filed on Apr. 29, 2013.

(51) Int. Cl.
*H01J 37/32* (2006.01)

(52) U.S. Cl.
CPC ......... *H01J 37/32853* (2013.01); *H01J 37/321* (2013.01); *H01J 37/3211* (2013.01); *H01J 37/32862* (2013.01); *H01J 37/32899* (2013.01); *H01J 37/32981* (2013.01)

(58) Field of Classification Search
None
See application file for complete search history.

(56) References Cited

U.S. PATENT DOCUMENTS

| | | | | |
|---|---|---|---|---|
| 6,035,868 A * | 3/2000 | Kennedy et al. | ................ | 134/1.1 |
| 6,318,384 B1 * | 11/2001 | Khan et al. | ................... | 134/22.1 |
| 6,566,270 B1 * | 5/2003 | Liu et al. | ........................ | 438/706 |
| 6,569,257 B1 * | 5/2003 | Nguyen et al. | .................. | 134/26 |
| 6,926,800 B2 * | 8/2005 | Tachino et al. | .......... | 156/345.48 |
| 7,695,763 B2 * | 4/2010 | Ishizuka et al. | ............. | 427/248.1 |
| 7,763,546 B2 * | 7/2010 | Kothari et al. | ................ | 438/710 |
| 7,820,981 B2 * | 10/2010 | Horsky et al. | .................. | 250/425 |
| 8,075,789 B1 * | 12/2011 | Littau et al. | ..................... | 216/63 |
| 8,606,358 B2 * | 12/2013 | Sachs | ............... | 607/43 |
| 2002/0117472 A1 * | 8/2002 | Sun et al. | ........................ | 216/68 |
| 2005/0016838 A1 | 1/2005 | Murata et al. | | |
| 2007/0102291 A1 | 5/2007 | Hartig | | |
| 2008/0317975 A1 * | 12/2008 | Furui et al. | .................... | 427/575 |
| 2009/0035945 A1 * | 2/2009 | Fujii et al. | ..................... | 438/758 |
| 2010/0055345 A1 * | 3/2010 | Biloiu et al. | .................. | 427/569 |
| 2011/0108058 A1 * | 5/2011 | Srivastava et al. | ............. | 134/1.1 |
| 2011/0308544 A1 * | 12/2011 | Osada et al. | .................... | 134/1.1 |

FOREIGN PATENT DOCUMENTS

| | | |
|---|---|---|
| JP | 2000-340165 A | 12/2000 |
| JP | 2004-241510 A | 8/2004 |

OTHER PUBLICATIONS

International Search Report and Written Opinion mailed Aug. 14, 2014 for PCT Application, PCT/US2014/034370 Filed Apr. 16, 2014.

* cited by examiner

*Primary Examiner* — Douglas W Owens
*Assistant Examiner* — Srinivas Sathiraju

(57) ABSTRACT

A self-cleaning radio frequency (RF) plasma source for a semiconductor manufacturing process is described. Various examples provide an RF plasma source comprising an RF antenna and a rotatable dielectric sleeve disposed around the RF antenna. The dielectric is positioned between a process chamber and cleaning chamber such that portions of the surface of the dielectric may be exposed to either the process chamber or the cleaning chamber. As material is deposited on the outer surface of the dielectric in the process chamber, the dielectric sleeve is rotated so that the portion containing the buildup is exposed to the cleaning chamber. A sputtering process in the cleaning chamber removes the buildup from the surface of the sleeve. The dielectric sleeve is then rotated so that it exposed to the process chamber. Other embodiments are disclosed and claimed.

17 Claims, 7 Drawing Sheets

SELF-CLEANING RADIO FREQUENCY PLASMA SOURCE

CROSS-REFERENCE TO RELATED APPLICATIONS

This is a non-provisional of pending U.S. Provisional Patent Application Ser. No. 61/817,200, filed Apr. 29, 2013, the entirety of which application is incorporated herein by reference.

FIELD OF THE DISCLOSURE

Embodiments of the present disclosure generally relate to the field of substrate processing, and more particularly to a self-cleaning radio frequency source used in plasma processing systems.

BACKGROUND OF THE DISCLOSURE

Plasma ions are often used during manufacturing of semiconductor devices. For example, ion implantation is used to accelerate ions from a plasma towards and into a substrate in order to implant the substrate with various dopants. With some plasma processes, the plasma is formed with the aid of radio frequency (RF) waves emitted from an RF antenna.

The RF antenna may be located within a plasma chamber and enclosed within a dielectric sleeve. Alternatively, the RF antenna may be located outside the plasma, with a dielectric window disposed between the RF antenna and the substrate.

During the plasma process material may be deposited onto the dielectric sleeve or the dielectric window. If sufficient material is deposited onto the sleeve, the functionality of the RF antenna can be compromised. In such cases, the system must be shut down and the deposits removed manually. It would be desirable, therefore, to provide a system and method for removing such deposits automatically so that the deposits are being continually removed/cleaned from the surface of the dielectric, thereby eliminating the need to periodically shut down for manual cleaning.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In general, various embodiments of the present disclosure provide a plasma system comprising a plasma chamber, a cleaning chamber positioned adjacent to the plasma chamber, an RF antenna, and a dielectric sleeve disposed around the RF antenna, the dielectric sleeve disposed in a gap in a shared wall between the plasma chamber and the cleaning chamber; wherein the dielectric sleeve is rotatable such that in a first position an outer surface of the dielectric sleeve is exposed to the plasma process and a second portion of the outer surface of the dielectric sleeve is exposed within the cleaning chamber, and in a second position the outer surface of the dielectric sleeve is exposed to the cleaning chamber and the second portion of the outer surface of the dielectric sleeve is exposed to the plasma chamber. In some embodiments the cleaning chamber contains a plasma.

As an alternative example, some embodiments disclose a plasma system comprising a plasma chamber and a cleaning chamber having a shared wall therebetween, an RF antenna, and a dielectric sleeve disposed around the RF antenna, the dielectric sleeve further disposed in a gap in the shared wall; wherein the dielectric sleeve is rotatable such that an outer surface of the dielectric sleeve is selectively exposable to the plasma chamber or the cleaning chamber. In some embodiments the cleaning chamber contains a plasma.

Further embodiments include a method for cleaning a dielectric sleeve disposed around an RF antenna used in a plasma process. The method may comprise positioning a dielectric sleeve such that a first portion of the dielectric sleeve is exposed to a plasma chamber and a second portion of the dielectric sleeve is exposed to a cleaning chamber, rotating the dielectric sleeve so that the first portion is exposed to the cleaning chamber and the second portion is exposed to the plasma chamber, and performing a sputter process in the cleaning chamber to remove material build-up from the first portion of the dielectric sleeve.

BRIEF DESCRIPTION OF THE DRAWINGS

By way of example, various embodiments of the disclosed device will now be described, with reference to the accompanying drawings, in which.

DETAILED DESCRIPTION

The disclosed self-cleaning RF plasma sources and methods are described in connection with a general plasma processing system. As will be appreciated, however, the described plasma processing system can be used with a variety of different plasma processes. For example, at least some embodiments of the present disclosure may be used with a plasma-enhanced chemical vapor deposition process. Furthermore, at least some embodiments of the present disclosure may be used with a plasma-immersion ion implantation process. Additionally, the described plasma processing system may be used with any of a variety of substrates and or plasma materials. Examples provided below are given for illustrative purposes only and are not intended to be limiting. Various embodiments of the present disclosure may be applied to any of a variety of types of plasma processes and systems, including beam line ion implant processes and system, or plasma enhanced chemical vapor deposition (PECVD) systems.

Figure 1:
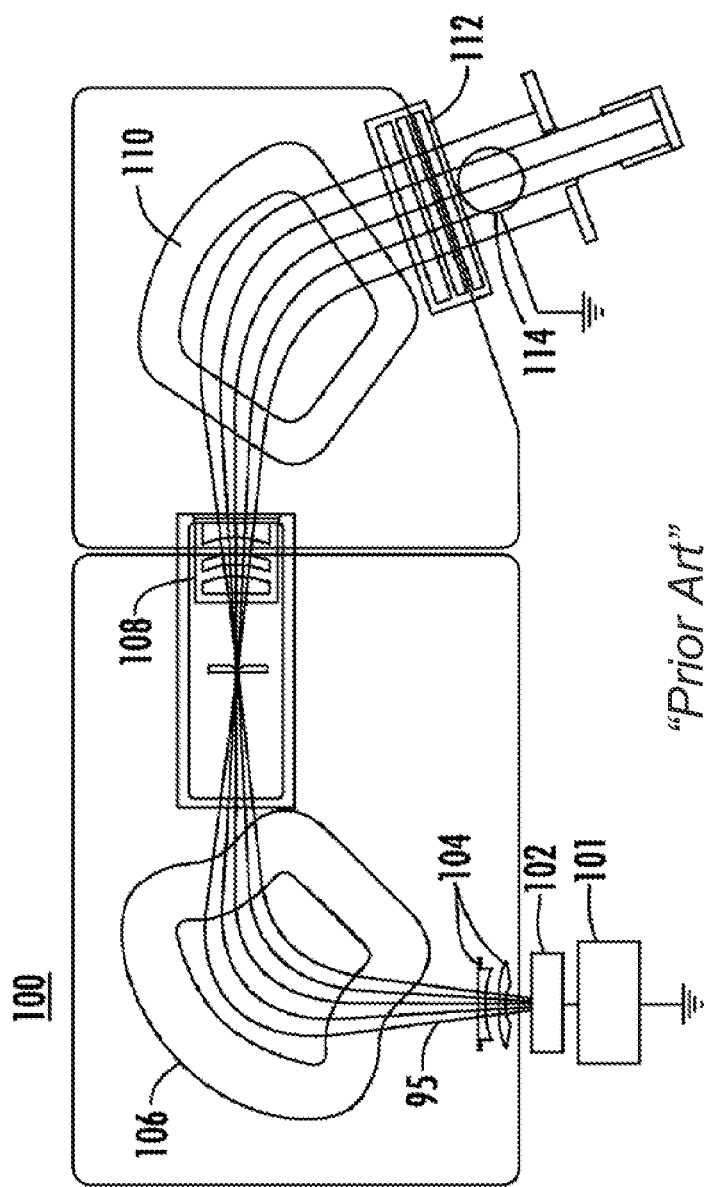
FIG. 1 depicts an ion implantation system consistent with various embodiments of the disclosure.

Referring to the drawings, FIG. 1 is a block diagram of an embodiment of an ion implantation system 100 including an ion source 102, which is a hybrid ion source whose operation is detailed below. A power supply 101 supplies the required energy to source 102 which is configured to generate ions of a particular species. The generated ions are extracted from the source through a series of electrodes 104 (extraction electrodes) and formed into a beam 95 which is manipulated and directed to a substrate using various beam components 106, 108, 110, 112. After extraction, the beam 95 passes through a mass analyzer magnet 106. The mass analyzer is configured with a particular magnetic field such that only the ions with a desired mass-to-charge ratio are able to travel through the analyzer. Ions of the desired species pass through deceleration stage 108 to corrector magnet 110. Corrector magnet 110 is energized to deflect ion beamlets in accordance with the strength and direction of the applied magnetic field to provide a ribbon beam targeted toward a work piece or substrate positioned on support (e.g. platen) 114. In some cases, a second deceleration stage 112 may be disposed between corrector magnet 110 and support 114. The ions lose energy when they collide with electrons and nuclei in the substrate and come to rest at a desired depth within the substrate based on the acceleration energy.

Figure 2A:
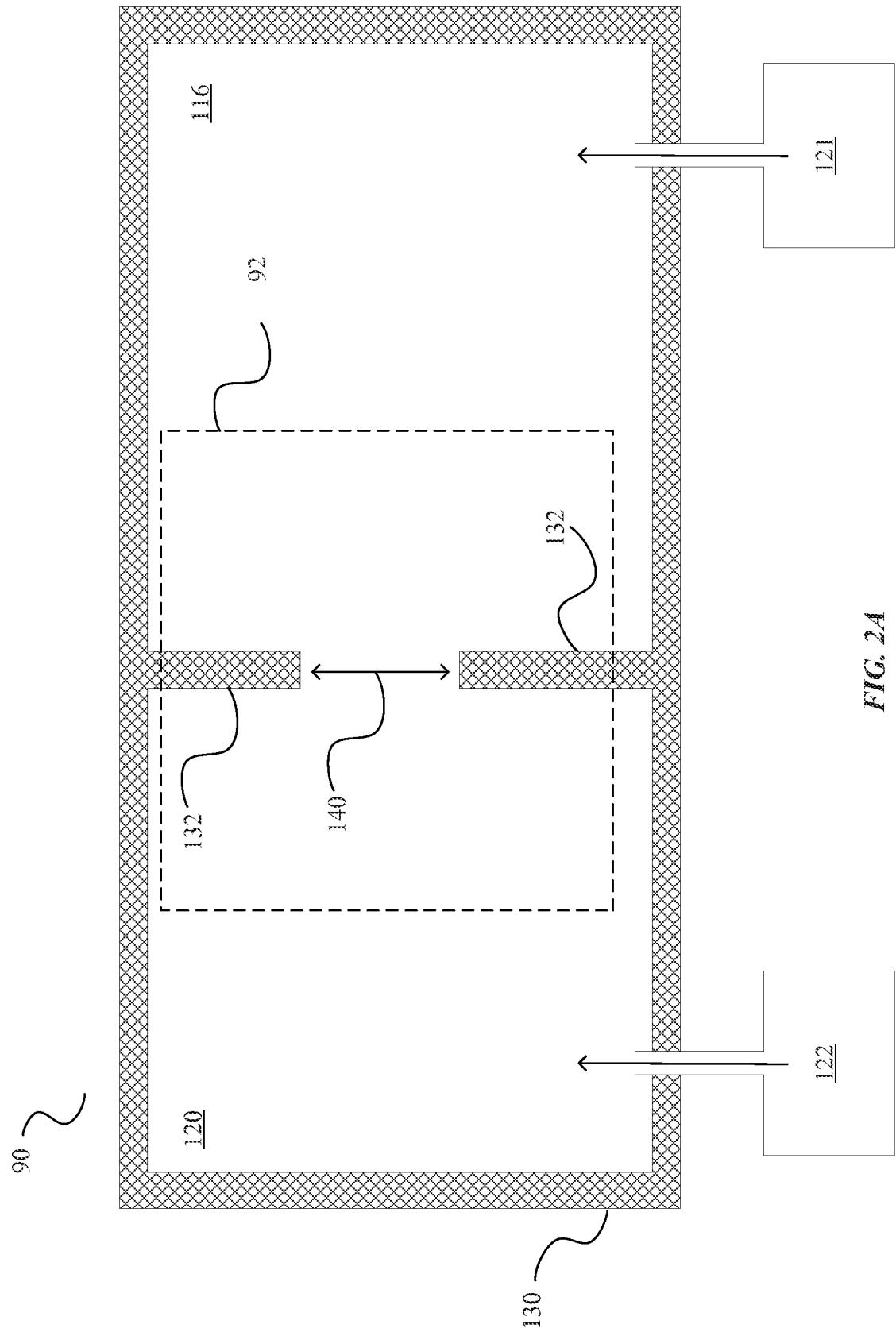
FIGS. 2A-2F are block diagrams of a portion of a semiconductor manufacturing system including an RF plasma source.

FIG. 2A illustrates a block diagram of a portion of a semiconductor manufacturing system 90 including an RF plasma source (described later with reference to FIGS. 2B-2F.) As depicted, the system 90 includes a plasma chamber 116 and a cleaning chamber 120, formed by walls 130 and shared wall 132. In one exemplary embodiment the plasma chamber 116 is a source chamber that houses an ion source 102 such as that depicted in FIG. 1. As further depicted, shared wall 132 has a gap 140 therein. Gas sources 121 and 122 are shown connected to the plasma chamber 116 and the cleaning chamber 120 respectively. During operation of the system 90, the gas sources 121 and 122 may be used to add gaseous material into the plasma chamber 116 and the cleaning chamber 120. As will be described in greater detail later, in some embodiments the cleaning chamber 120 contains a plasma. The system 90 may include additional components for use in a semiconductor manufacturing process. All of the components necessary and/or optionally used in a semiconductor manufacturing process may not be shown in FIGS. 2A-2F. This is done for purposes of clarity and is not intended to be limiting. For example, the system 90 may include vacuum pumps for exhausting gas from the plasma chamber 116 and the cleaning chamber 120. Additionally, monitoring and/or control instruments for monitoring and/or controlling a semiconductor manufacturing process may be included with the system 90.

Figure 2B:
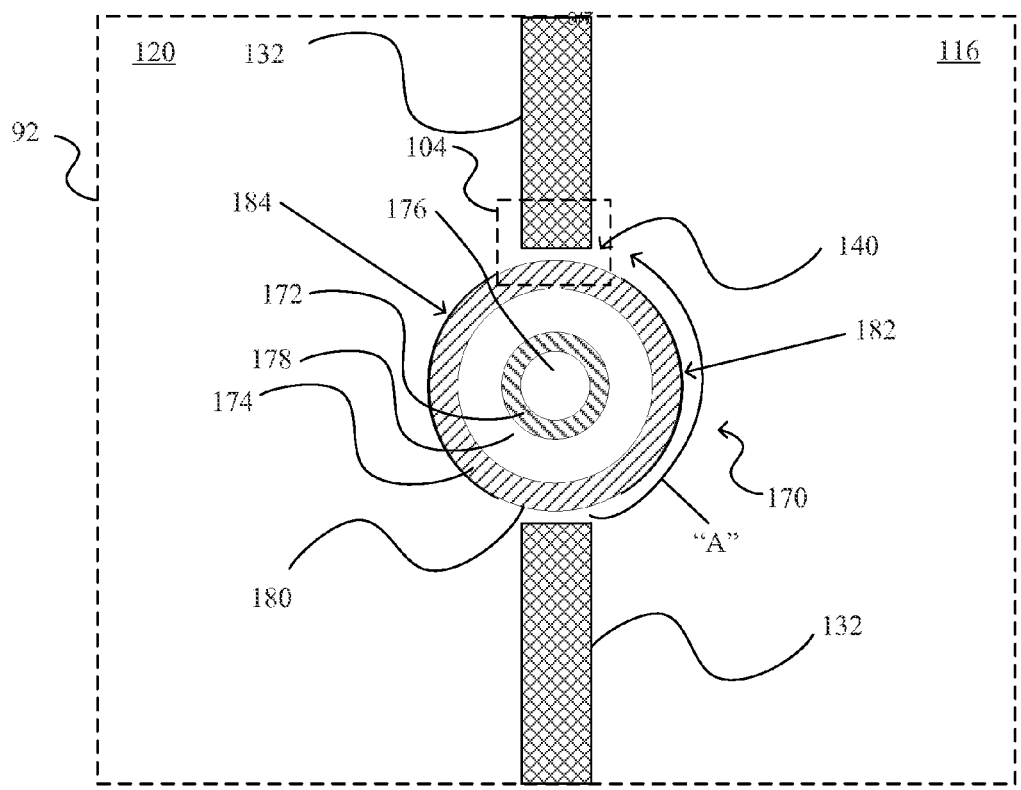

FIG. 2B is an enlarged view of a portion 92 of the system 90. As can be seen from this figure, an RF plasma source 170 is disposed in the gap 140 of the shared wall 132. The RF plasma source 170 is shown including an RF antenna 172 and a dielectric sleeve 174 disposed around the RF antenna 172. With some embodiments, an air gap 178 between the RF antenna 172 and the dielectric sleeve 174 may be present. In some examples, the dielectric sleeve 174 may be made of quartz. The RF plasma source 170 may additionally include a cooling chamber 176 (e.g., for flowing water or other coolant) disposed within the RF antenna 172. As depicted, the dielectric sleeve has an outer surface 180 that is exposed to the atmosphere of the plasma chamber 116 and the atmosphere of the cleaning chamber 120. More specifically, a first portion 182 of the outer surface 180 is located within and exposed to the atmosphere of the plasma chamber 116 and a second portion 184 of the outer surface 180 is located within and exposed to the atmosphere of the cleaning chamber 120.

Figure 2C:
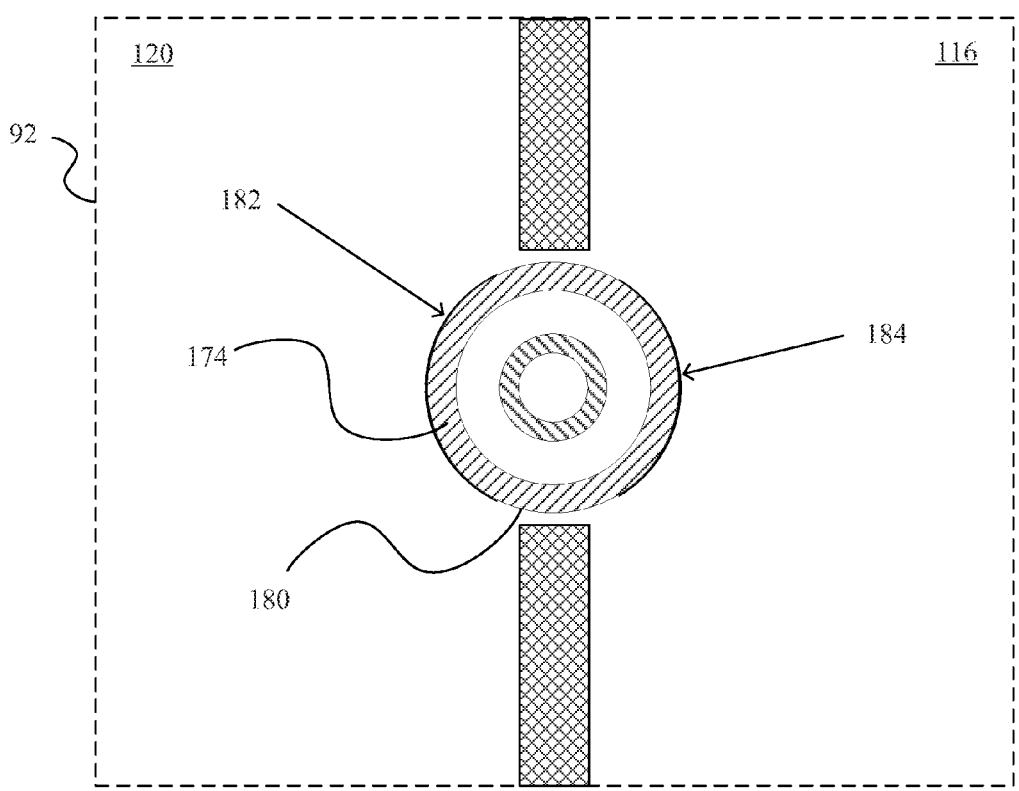

The dielectric sleeve 174 can be rotatable in the direction of arrow "A" such that the first and second portions 182 and 184 of the outer surface 180 can be selectively exposed to either the plasma chamber 116 or the cleaning chamber 120. For example, FIG. 2C shows the portion 92 of the system 90 including the dielectric sleeve 174 rotated so that the second portion 184 of the outer surface 180 is exposed to the plasma chamber 116, while the first portion 182 of the outer surface 180 is exposed to the cleaning chamber 120. In some examples, the dielectric sleeve 174 may be rotatable by a full 360 degrees, while in other examples the dielectric sleeve 174 may be rotatable by less than 360 degrees (e.g., 180 degrees) about the RF antenna 172.

Although not shown, it will be appreciated that any of a variety of mechanisms can be used to obtain the desired rotation of the dielectric sleeve, including servo-motors and the like. In addition, although the dielectric sleeve 174 is shown as being centrally located within the gap 140, this is not critical. For example, the dielectric sleeve 174 could be shifted toward the plasma chamber 116 so that a greater proportion of the dielectric sleeve 174 is positioned within the plasma chamber 116 as compared to the cleaning chamber 120. As such, the gap 140 could be dimensioned to be smaller than the gap shown in FIGS. 2A-2C. Alternatively, the dielectric sleeve 174 could be shifted toward the cleaning chamber 120 so that a greater proportion of the dielectric sleeve 174 is positioned within the cleaning chamber 120 as compared to the plasma chamber 116.

In one exemplary non-limiting embodiment, the plasma chamber 116 may be a chamber for use in depositing thin films of material on the substrate. As will be appreciated, various types of materials can be deposited on the substrate. In one exemplary embodiment, process gas may be flowed from the gas source 121 into the plasma chamber 116. Energy from the RF plasma source 170, and particularly the RF antenna 172, may then be used to excite the process gas such that atoms within the process gas are ionized to form a plasma which can be used to process the substrate. As described above, material may also be deposited on the dielectric sleeve 174. For example, in some semiconductor manufacturing processes, materials having metal ions, such as, for example, tin, copper, silver, or gold, may be deposited on the dielectric sleeve. When the material deposited is conductive, the material may absorb the RF waves emitted from the RF antenna 172, thus reducing the effectiveness of the RF antenna in producing a plasma in the plasma chamber 116. Accordingly, the dielectric material between the RF plasma source and the plasma process chamber may require regular cleaning to remove material build-up, which as previously noted can interrupt the process and/or cause down time for the system.

Figure 2D:
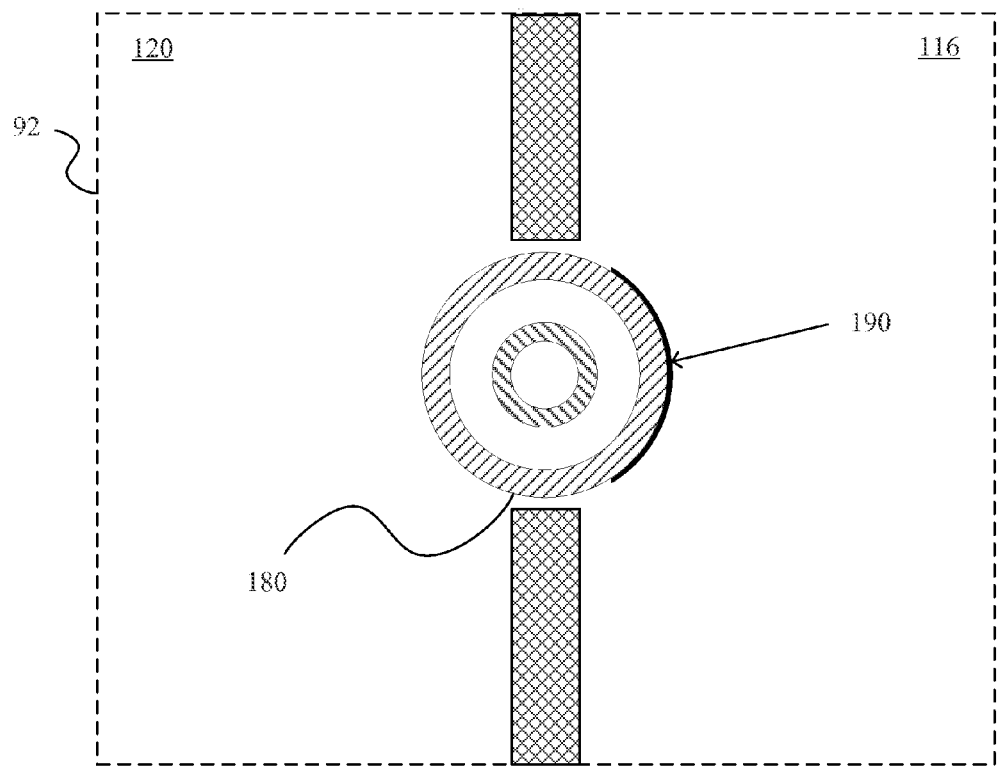

FIG. 2D shows the portion 92 of the system 90 including the dielectric sleeve 174 having buildup layer 190 deposited on a portion of the surface 180 due to exposure to the plasma in the plasma chamber 116 during an exemplary process. With various embodiments of the present disclosure, the dielectric sleeve 174 may be rotated, as described above, either during a plasma process, or after a plasma process, in order to cause the portion of the surface 180 having buildup layer 190 deposited thereon to be rotated so that it is exposed to the cleaning chamber 120 instead of the plasma chamber 116.

Figure 2E:
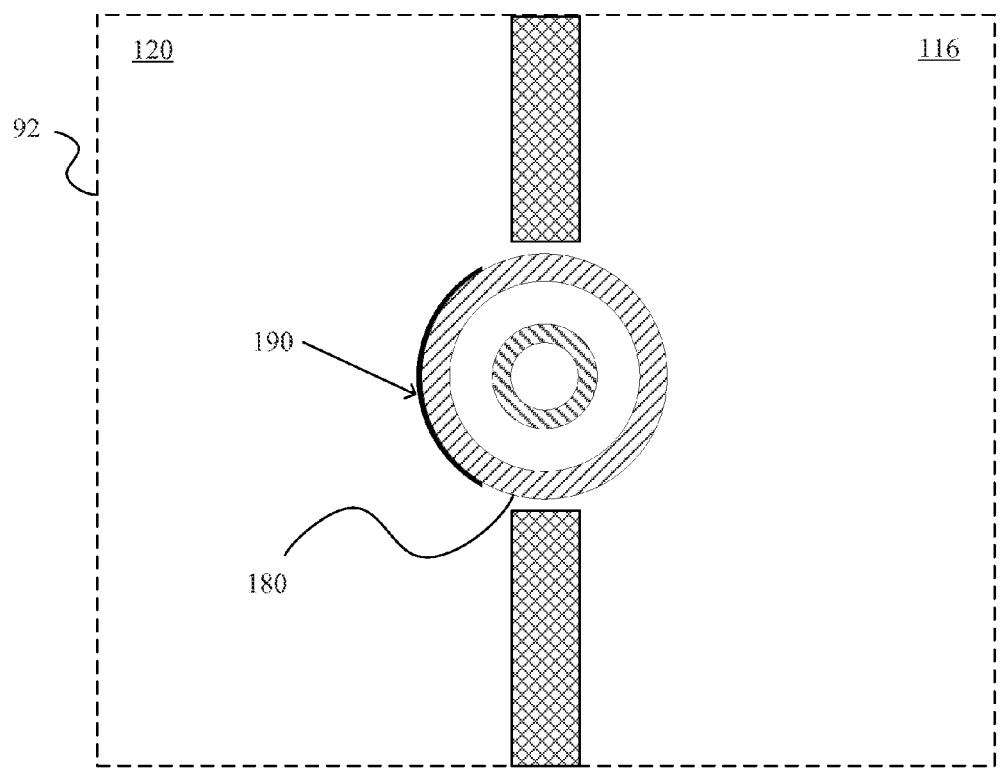

For example, FIG. 2E shows the portion 92 of the system 90 including the dielectric sleeve 174, rotated from the position show in FIG. 2D. As depicted, the buildup layer 190 is now exposed to the atmosphere of the cleaning chamber 120. Furthermore, the portion of the surface 180 located in the plasma chamber 116 is shown as being substantially free from material buildup. In general, the material 190 may be cleaned from the dielectric sleeve 174 by flowing process gas, such as, for example argon, from the gas source 122 into the cleaning chamber 120, and exciting the argon gas within the cleaning chamber to form an argon plasma. As will be appreciated, argon may cause sputtering within the cleaning chamber, but may result in little to no deposition of additional material on exposed surfaces. Accordingly, the buildup layer 190 may be removed from the surface 180 of the dielectric sleeve 174 through this argon sputtering process. As previously noted, this sputter removal of buildup on the dielectric sleeve can be performed periodically (e.g., the antenna may be rotated 180-degrees once per day), or it can be performed continuously (e.g., the antenna may be rotated 1-degree per minute on a constant basis).

Figure 2F:
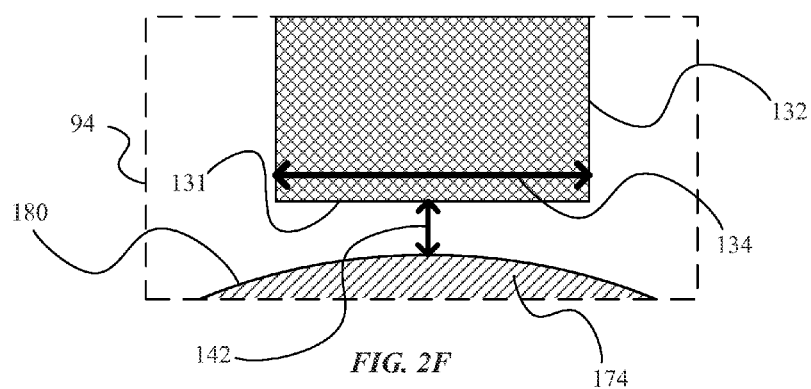

In some embodiments, the tolerance between the walls 132 and the RF plasma source 170, including the dielectric sleeve 174 may be such that leakage (e.g., flow, diffusion) between the plasma chamber 116 and the cleaning chamber 120 is minimized. For example, FIG. 2F shows an enlarged view of a portion 94 of the system 90. As depicted, the shared wall 132 may have a width 134, determined to minimize the interchange of process gas between the plasma chamber 116 and the cleaning chamber 120. Additionally, the distance 142 between the surface 180 of the dielectric sleeve 174 and the end surface 131 of the shared walls 132 may be determined to minimize leakage of process gas from the plasma chamber 116 to the cleaning chamber 120 and vise-versa.

In some embodiments, the width 134 of the shared wall 132 may be greater than or equal to 500 millimeters. In some embodiments, the distance 142 between the surface 180 of the dielectric sleeve 174 and the ends 131 of the shared wall 132 may be less than or equal to 2 millimeters. As will be appreciated, many processes use low pressure. As such, even where some leakage or diffusion of gasses between the plasma chamber 116 and the cleaning chamber 120 occurs, the leakage may be less than 1 or 2% of the total processes gas flow.

As depicted, the system 90 has separate gas sources for each plasma chamber. More particularly, the gas source 121 is shown supplying as to the plasma chamber 116 and the gas source 122 is shown supplying gas to the cleaning chamber 120. With some examples, the gas supplied by the gas source 122 may be initially flowed into the cleaning chamber 120 from the gas source 122, where it may be used in a cleaning process. The cleaning gas, may subsequently be flowed into the plasma chamber 116 to be used a dilatant to the processing gas supplied by the gas source 121.

Figure 3:
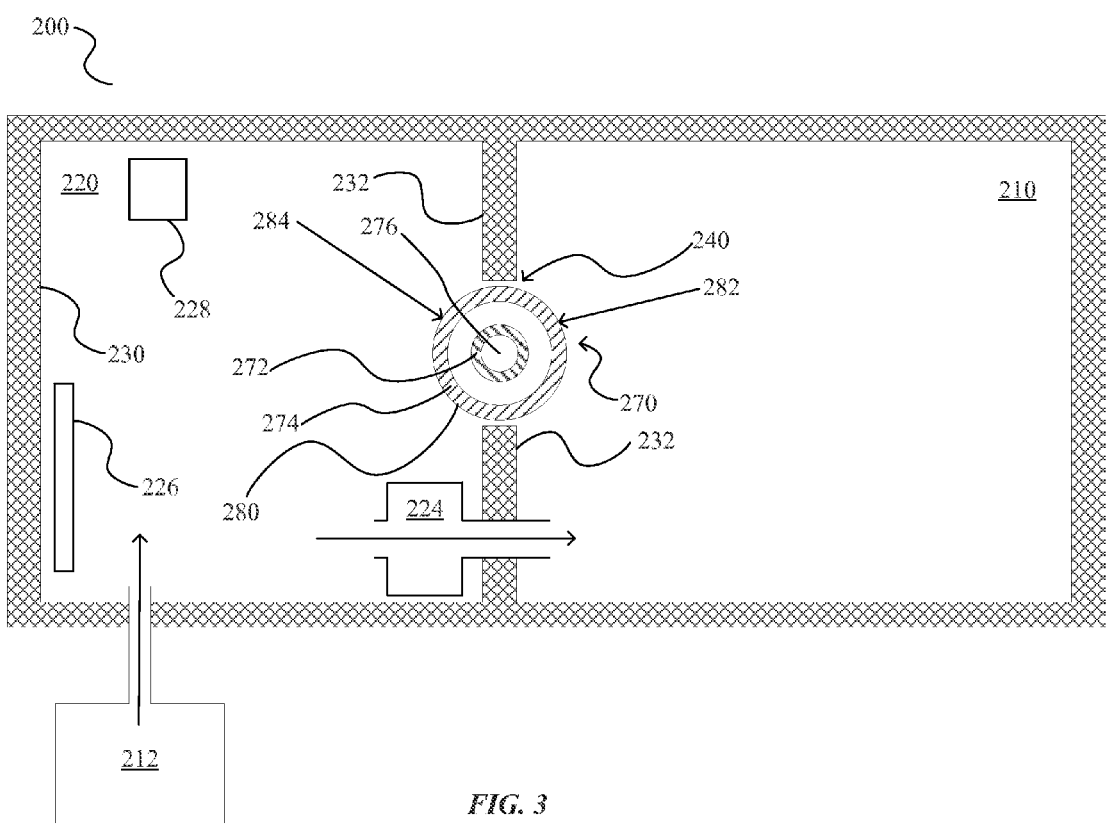
FIG. 3 is a block diagram of a portion of another semiconductor manufacturing system including an RF plasma source.
Figure 4:
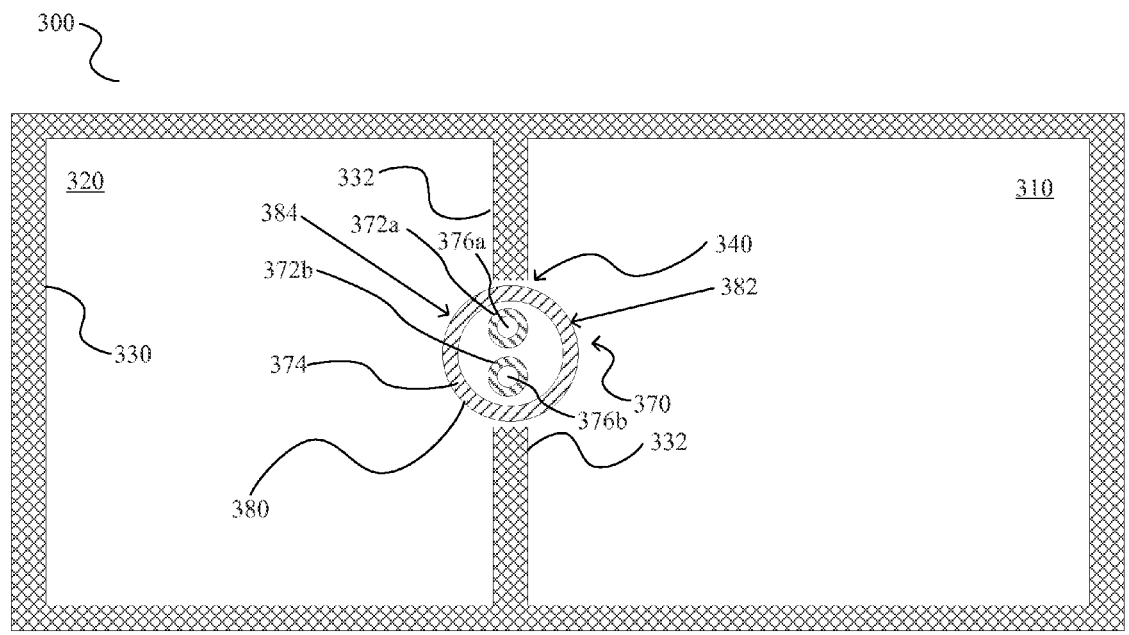
FIG. 4 is a block diagram of a portion of a semiconductor manufacturing system including an RF plasma source having multiple RF antennas.
Figure 5:
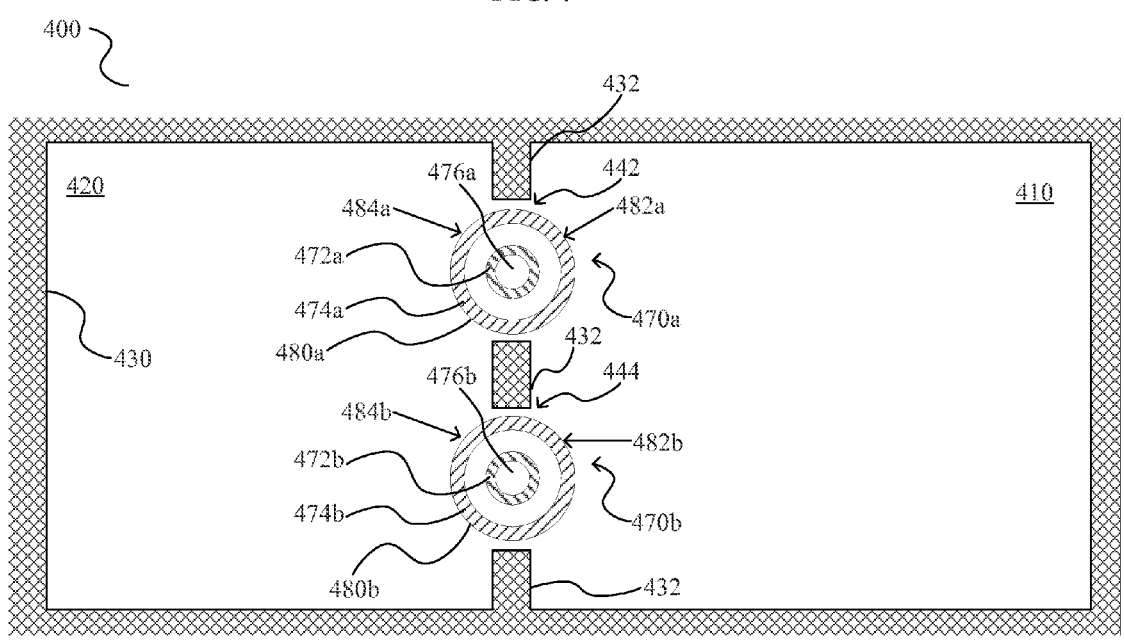
FIG. 5 is a block diagram of a portion of a semiconductor manufacturing system including multiple RF plasma sources.

FIGS. 3-5 show embodiments that are similar to the system 90 described above. For example, FIG. 3 shows a block diagram of a system 200 including an RF plasma source 270. As depicted, the system 200 includes a plasma chamber 210 and a cleaning chamber 220, formed by walls 230 and shared wall 232. As further depicted, shared wall 232 has a gap 240 therein. The RF plasma source 270 is disposed in the gap 240 of the shared wall 232. The RF plasma source 270 is shown including an RF antenna 272 and a dielectric sleeve 274 enclosed around the RF antenna 272. In some examples, the dielectric sleeve 274 may be made of quartz. As depicted, the dielectric sleeve 274 has an outer surface 280, a portion of which is exposed to the atmosphere of the plasma process chamber 210 and another portion of which is exposed to the atmosphere of the cleaning chamber 220. More specifically, a first portion 282 of the outer surface 280 is located within and exposed to the plasma chamber 210 and a second portion 284 of the outer surface 280 is located within and exposed to the cleaning chamber 220. The RF plasma source 270 may additionally include a cooling chamber 276 (e.g., for flowing water or other coolant) disposed within the RF antenna 272.

The system 200 is also depicted including a gas sources 212 connected to the cleaning chamber 220. During operation of the system 200, the gas sources 212 may be used to add gaseous material into the cleaning chamber 220 in order to clean material from the surface 180 of the dielectric 174. A vacuum pump 224 is also configured to pump gas from the cleaning chamber 220 into the plasma process chamber 210.

As will be appreciated, some processes use gas suitable for cleaning (e.g., argon, or the like) to dilute the process gas in the plasma process chamber 210. Accordingly, the vacuum pump 224 may be used to exhaust the gases from the cleaning chamber 220 to the plasma process chamber 210 during a semiconductor manufacturing process. Additionally, the vacuum pump 224 may be used to control the pressures in the cleaning chamber 220 and the plasma chamber 210 in order to vary the plasma density during a semiconductor manufacturing process.

The system 200 may also include an electrode 226, which may be biased with varying electrical potential in order to adjust the plasma potential in the cleaning chamber 220. Additionally, a sensor 228 may be disposed in, or otherwise coupled to, the cleaning chamber 220. In some examples, the cleaning of material from the surface 280 of the dielectric sleeve 274 may be monitored via the sensor 228. For example, if the material includes copper, as the copper is being cleaned (e.g., via sputtering in the cleaning chamber 220, or the like) the presence of copper in the cleaning chamber 220 will be detectable with the sensor 228. As the cleaning process continues, the amount of copper detected by the sensor 228 may decrease, giving an indication that the material has been substantially removed from the surface 280 of the dielectric sleeve 274. In one embodiment the sensor 228 is a mass spectrometer.

FIG. 4 shows a block diagram of a semiconductor manufacturing system 300 including an RF plasma source 370 having a pair of RF antennas, namely a first RF antenna 372a and a second RF antenna 372b. As depicted, the system 300 includes a plasma chamber 310 and a cleaning chamber 320, formed by walls 330 and shared wall 332. As further depicted, shared wall 332 has a gap 340 therein. The RF plasma source 370 is disposed in the gap 340 of the shared wall 332. The RF plasma source 370 is shown including first and second RF antennas 372a and 372b, as well as a dielectric sleeve 374 enclosed around the RF antennas 372a and 372b. In some exemplary embodiments, the dielectric sleeve 374 may be made of quartz. As depicted, the dielectric sleeve 374 has an outer surface 380, a portions of which is exposed to the atmosphere of the plasma chamber 310 and a portion of which is exposed to the atmosphere of the cleaning chamber 320. More specifically, a first portion 382 of the outer surface 380 is located within and exposed to the plasma chamber 310 and a second portion 384 of the outer surface 380 is located within and exposed to the cleaning chamber 320. The RF plasma source 370 may additionally include a cooling chamber 376 (e.g., for flowing water or other coolant) disposed within the RF antenna 372.

FIG. 5 shows a block diagram of a semiconductor manufacturing system 400 including a first RF plasma source 470a and a second RF plasma source 470b. As depicted, the system 400 includes a plasma chamber 410 and a cleaning chamber 420, formed by walls 430 and shared wall 432. As further depicted, shared wall 432 has a first gap 442 and a second gap 444 therein. The first RF plasma source 470a is disposed in the gap 442 of the shared wall 432. The first RF plasma source 470a is shown including an RF antenna 472a and a dielectric sleeve 474a enclosed around the RF antennas 472a. In some examples, the dielectric sleeve 474a may be made of quartz. As depicted, the dielectric sleeve 474a has an outer surface 480a, a portion of which is exposed to the plasma process chamber 410 and a portion of which is exposed to the cleaning chamber 420. More specifically, a first portion 482a of the outer surface 480a is located within and exposed to the plasma chamber 410 and a second portion 484a of the outer surface 480a is located within and exposed to the cleaning chamber 420. The first RF plasma source 470a may additionally include a cooling chamber 476a (e.g., for flowing water or other coolant) disposed within the respective RF antenna 472a.

The second RF plasma source 470b is disposed in the gap 444 of the shared wall 432. The second RF plasma source 470b is shown including an RF antenna 472b and a dielectric sleeve 474b enclosed around the RF antennas 472b. In some examples, the dielectric sleeve 474b may be made of quartz. As depicted, the dielectric sleeve 474b has an outer surface 480b that is exposed within the plasma chamber 410 and the cleaning chamber 420. More specifically, a first portion 482b of the outer surface 480b is located within and exposed to the plasma chamber 410 and a second portion 484b of the outer surface 480b is located within and exposed to the cleaning chamber 420. The second RF plasma source 470b may additionally include a cooling chamber 476b (e.g., for flowing water or other coolant) disposed within the RF antenna 472b.

As noted, FIGS. 3-5 may be operated similar to that described above with respect to FIGS. 2A-2F. Additionally, as FIG. 5 depicts multiple dielectric sleeves (e.g., dielectric sleeve 474a and 474b), they may be rotated independently of each other, using different degrees of rotation and/or different intervals of rotation, as desired.

Figure 6:
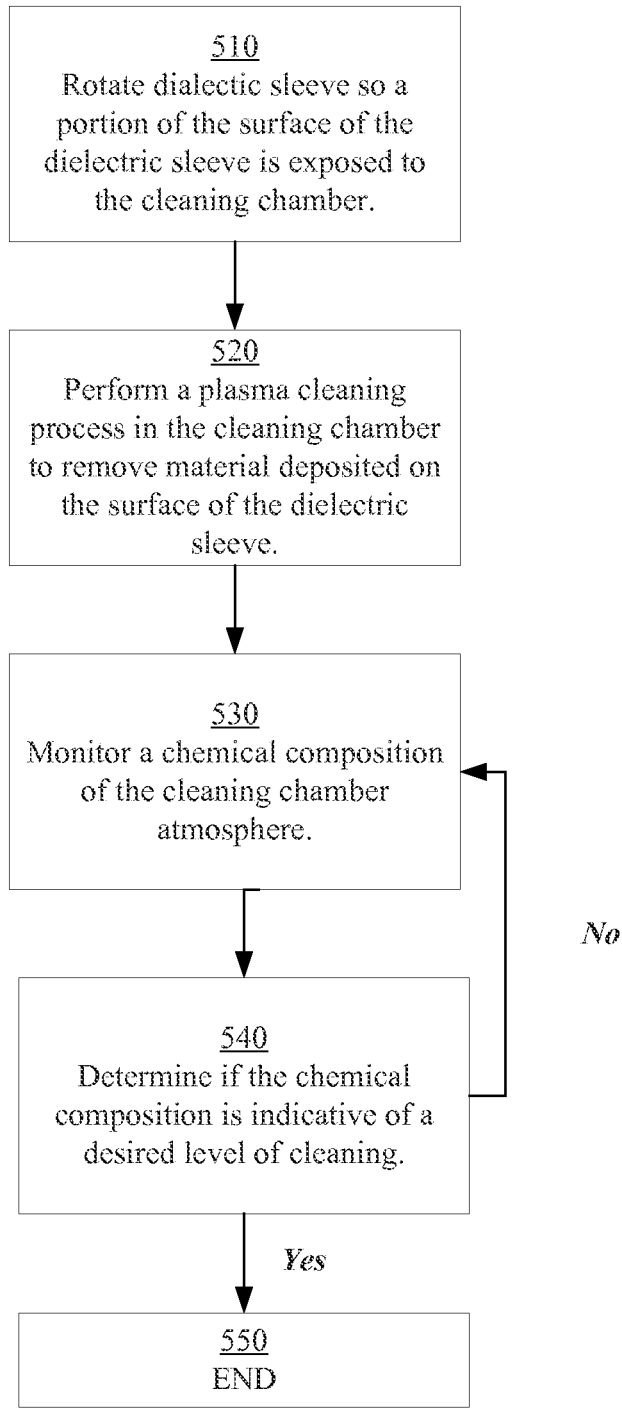
FIG. 6 is a flow chart illustrating a method of cleaning an RF plasma source, all arranged in accordance with at least some embodiments of the present disclosure.

FIG. 6 is a flow chart illustrating a method 500 of cleaning an RF plasma source, arranged in accordance with at least some embodiments of the present disclosure. In general, the method 500 is described with reference to the system 90 of FIGS. 2A-2F.

The method 500 may begin at block 510. At block 510, the dielectric sleeve 174 may be rotated such that the portion of the dielectric sleeve 174 having material 190 deposited ("build-up") thereon is exposed to the cleaning chamber 120. In some examples, block 510 may be performed periodically. For example, as a semiconductor manufacturing process is being performed, the dielectric sleeve 174 may be rotated at set intervals, such as for example, every hour, every 4 hours, or the like. In some embodiments, the dielectric sleeve 174 may be rotated 180 degrees.

Continuing from block 510 to block 520, a plasma cleaning process may be performed in the cleaning chamber, wherein the material 190 may be removed from the surface 180 of the dielectric sleeve 174. For example, as part of the plasma cleaning process, argon gas may be added to the cleaning chamber 120, excited to form a plasma, which may cause sputtering in the cleaning chamber 120, which may in turn cause the material 190 to be removed from the surface 180 of the dielectric 174. At block 530, the chemical composition of the atmosphere in the cleaning chamber 120 may be sampled. At block 540, a determination is made as to whether the sample indicates a desired degree of cleaning (i.e., removal of the material 190 from the RF antenna) has been achieved. If a desired degree of cleaning is determined to be achieved, then the process ends at block 550. If, however, a desired degree of cleaning is determined not to be achieved, the process returns to step 520. The process continues from there.

As described above, the material 190 may cause interference with the RF waves emitted from the RF antenna 172. This may be especially true where the material 190 is electrically conductive. As such, if the material 190 is allowed to build up enough to substantially absorb the RF waves, the gas may not be able to be exited into a plasma state. Accordingly, rotating the dielectric sleeve 174, at block 510, and then cleaning the material 190, at block 520, may be done at intervals such that the material 190 does not build up enough to completely interfere with the process in the cleaning chamber.

In some examples, once the cleaning is done, the dielectric sleeve 174 may be rotated back into the original position. In other embodiments, the dielectric sleeve may be continually rotated as the semiconductor manufacturing and cleaning processes occur simultaneously.

It will be appreciated that the disclosed system and method may be used to provide self-cleaning or in situ cleaning of an RF plasma source used in a semiconductor manufacturing process. As such, the dielectric around an RF antenna may be cleaned while the semiconductor manufacturing process is ongoing. More specifically, by rotating the dielectric to expose portions of the surface to the cleaning chamber, material deposited on the surface while exposed to the plasma chamber environment may be removed.

It will also be appreciated that the disclosed arrangement can be used in any of a variety of plasma sources including plasma sources in beamline ion implantation systems, or PECVD or other plasma processing systems.

Some embodiments of the disclosed device may be implemented, for example, using a storage medium, a computer-readable medium or an article of manufacture which may store an instruction or a set of instructions that, if executed by a machine, may cause the machine to perform a method and/or operations in accordance with embodiments of the disclosure. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory (including non-transitory memory), removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A plasma source, comprising: a plasma chamber, a cleaning chamber positioned adjacent to the plasma chamber; an RF antenna; and
a dielectric sleeve disposed around the RF antenna, the dielectric sleeve disposed in a gap in a shared wall between the plasma chamber and the cleaning chamber; wherein the dielectric sleeve is rotatable such that in a first position an outer surface of the dielectric sleeve is exposed to the plasma chamber and a second portion of the outer surface of the dielectric sleeve is exposed within the cleaning chamber, and in a second position the outer surface of the dielectric sleeve is exposed to the cleaning chamber and the second portion of the outer surface of the dielectric sleeve is exposed to the plasma chamber.

2. The plasma source of claim 1, further comprising: a gas source associated with the cleaning chamber, the gas source configured to dispense gas into the cleaning chamber.

3. The plasma source of claim 2, wherein the gas source is configured to dispense gas that is compatible with a process gas in the plasma chamber.

4. The plasma source of claim 1, further comprising a sensor for monitoring a chemical composition of an atmosphere in the cleaning chamber.

5. The plasma source of claim 1, wherein a distance between the outer surface of the dielectric sleeve and the shared wall is less than or equal to 2 millimeters.

6. The plasma source of claim 1, further comprising an electrode disposed within the cleaning chamber for exciting a cleaning gas disposed in the cleaning chamber to thereby provide sputter cleaning of the outer surface of the dielectric sleeve.

7. A plasma source, comprising:
a plasma chamber and a cleaning chamber having a shared wall therebetween;
an RF antenna; and
a dielectric sleeve disposed around the RF antenna, the dielectric sleeve further disposed in a gap in the shared wall; wherein the dielectric sleeve is rotatable such that an outer surface of the dielectric sleeve is selectively exposable to the plasma chamber or the cleaning chamber.

8. The plasma source of claim 7, further comprising an electrode disposed within the cleaning chamber for exciting a cleaning gas in the cleaning chamber to provide sputter cleaning of the outer surface of the dielectric sleeve.

9. The plasma source of claim 7, wherein the dielectric sleeve is continuously rotatable.

10. The plasma source of claim 7, wherein the dielectric sleeve is periodically rotatable.

11. The plasma source of claim 7, further comprising: a gas source coupled to the cleaning chamber, and an electrode disposed within the cleaning chamber, the electrode configured to excite a cleaning gas provided by the gas source to sputter clean the outer surface of the dielectric sleeve.

12. The plasma source of claim 7, further comprising a sensor associated with the cleaning chamber, the sensor configured to monitor a chemical composition of an atmosphere in the cleaning chamber.

13. The plasma source of claim 7, wherein a distance between the outer surface of the dielectric sleeve and the shared wall is less than or equal to 2 millimeters.

14. A plasma source, comprising:
a plasma chamber;
a cleaning chamber separated from the plasma chamber by a wall; and
an RF antenna having a dielectric sleeve, the RF antenna and dielectric sleeve positioned in an opening in the wall, wherein the dielectric sleeve is rotatable such that an outer surface of the dielectric sleeve is selectively exposable to the plasma chamber and the cleaning chamber.

15. The plasma source of claim 14, further comprising an electrode disposed within the cleaning chamber for exciting a cleaning gas in the cleaning chamber to provide sputter cleaning of an outer surface of the dielectric sleeve.

16. The plasma source of claim 14, further comprising: a gas source coupled to the cleaning chamber, and an electrode disposed within the cleaning chamber, the electrode configured to excite a cleaning gas provided by the gas source to sputter clean an outer surface of the dielectric sleeve.

17. The plasma source of claim 14, wherein a distance between an outer surface of the dielectric sleeve and the wall is less than or equal to 2 millimeters.

* * * * *